United States Patent [19]

Takano et al.

[11] Patent Number: 5,232,909
[45] Date of Patent: Aug. 3, 1993

[54] METHOD FOR MANUFACTURING SUPERCONDUCTING CERAMICS ELONGATED BODY

[75] Inventors: Satoshi Takano; Kenichi Takahashi; Kenji Miyazaki; Noriyuki Yoshida; Shinji Inazawa; Noriki Hayashi, all of Osaka, Japan

[73] Assignee: Sumitomo Electric Industries, Ltd., Osaka, Japan

[21] Appl. No.: 862,103

[22] Filed: May 8, 1992

Related U.S. Application Data

[62] Division of Ser. No. 234,643, Aug. 22, 1988, Pat. No. 5,112,802.

[30] Foreign Application Priority Data

| Aug. 20, 1987 | [JP] | Japan | 62-207743 |
| Aug. 20, 1987 | [JP] | Japan | 62-207744 |
| Aug. 21, 1987 | [JP] | Japan | 62-208924 |
| Aug. 21, 1987 | [JP] | Japan | 62-208925 |
| Aug. 22, 1987 | [JP] | Japan | 62-208886 |
| Aug. 22, 1987 | [JP] | Japan | 62-208887 |

[51] Int. Cl.$^5$ ................... B05D 5/12; H01B 12/00
[52] U.S. Cl. ................... 505/1; 505/704; 505/734; 505/735; 505/733; 505/737; 505/742; 427/62; 427/117; 427/226; 427/359; 427/376.1
[58] Field of Search ............. 505/1, 732, 737, 704, 505/734, 735, 733, 742; 427/62, 63, 226, 117, 359, 376.1; 174/125.1

[56] References Cited

U.S. PATENT DOCUMENTS

| 4,430,366 | 2/1984 | Crawford et al. | 427/162 |
| 4,925,829 | 5/1990 | Fujita et al. | 505/1 |
| 4,973,574 | 11/1990 | Nishio et al. | 505/1 |
| 5,017,550 | 5/1991 | Shioya et al. | 505/1 |

OTHER PUBLICATIONS

Koinuma et al., "High-Tc Superconductivity in screen printed Yb-Ba-Cu-O films", Jpn. J. Appl. Phys. 26(5) May 1987 pp. L761-762.
Shibata et al., "Superconducting Oxides by the sol-gel method using alkoxides", Jpn. J. Appl. Phys. 27(1) Jan. 1988 pp. L⊔-L54.

*Primary Examiner*—Roy King
*Attorney, Agent, or Firm*—Pennie & Edmonds

[57] ABSTRACT

A superconducting ceramics elongated body comprising a flexible ceramics elongated substrate and an oxide ceramics superconducting layer formed at least on a part of the surface of the ceramics elongated substrate to longitudinally extend along the ceramics elongated substrate. The superconducting ceramics elongated body further comprises a protective layer of ceramics containing a nitride, which is provided to at least cover the surface of the superconducting layer exposed on the ceramics elongated substrate. A method of manufacturing a superconducting ceramics elongated body by forming a longitudinally continuous superconducting layer on at least a part of the surface of a flexible ceramics elongated substrate. The superconducting layer is formed on the elongated substrate by a sol-gel method, a coating/sintering method, evaporation under oxygen ions, deposition from a fluoride solution or oxidation after application of corresponding fluorides.

8 Claims, 6 Drawing Sheets

METHOD FOR MANUFACTURING SUPERCONDUCTING CERAMICS ELONGATED BODY

This is a division, of application Ser. No. 07/234,643, filed Aug. 22, 1988, now U.S. Pat. No. 5,112,802.

BACKGROUND OF THE INVENTION

1. Field of the Invention

The present invention relates to a superconducting ceramics elongated body comprising a longitudinally extending oxide ceramics superconducting layer and a method of manufacturing the same.

2. Description of the Related Art

In recent years, a superconducting material of oxide ceramics has been highlighted because of is high critical temperature. The range of practicable use of such a superconducting material is being widened with increase in critical temperature. For example, study has been made in order to apply the material to a power transmission medium etc. in the field of power transmission/distribution.

The first problem to be solved for applying an oxide ceramics superconducting material to a power transmission medium or the like is how to elongate such a superconducting material. Further, a satisfactorily elongated superconducting material must have appropriate flexibility since the same is wound on a reel or the like in practice. Thus, the second problem to be solved for applying the oxide ceramics superconducting material to a power transmission medium or the like is how to provide appropriate flexibility.

SUMMARY OF THE INVENTION

An object of the present invention is to provide a flexible superconducting ceramics elongated body and a method of manufacturing the same.

The superconducting ceramics elongated body according to the present invention comprises a flexible ceramics elongated substrate and an oxide ceramics superconducting layer formed on at least a part of the surface of the ceramics elongated substrate to longitudinally extend along the ceramics elongated substrate. Thus, an oxide ceramics superconducting material, forming the oxide ceramics superconducting layer which extends longitudinally along the surface of the ceramics elongated substrate, can be easily elongated with the ceramics elongated substrate serving as a matrix. Further, the superconducting ceramics elongated body can be flexibly manufactured since the oxide ceramics superconducting layer can be formed in thickness not inhibiting flexibility of the ceramics elongated substrate.

The superconducting ceramics elongated body according to the present invention preferably includes a protective layer of ceramics containing a nitride, which is adapted to at least cover surfaces of the superconducting layer exposed on the ceramics elongated substrate. According to such an aspect, the entire surfaces of the oxide ceramics material forming the superconducting layer are covered with the ceramics elongated substrate and the protective layer, whereby the oxide ceramics superconducting layer can be protected against moisture and humidity. The protective layer, thus serving as a water- or moisture-resistant cover for the oxide ceramics superconducting layer, can be formed in thickness not inhibiting flexibility of the ceramics superconducting substrate, similarly to the oxide ceramics superconducting layer.

The oxide ceramics superconducting material for forming the oxide ceramics superconducting layer included in the inventive superconducting ceramics elongated body has perovskite-type crystal structure, for example. In more concrete terms, examples of such an oxide ceramics superconducting material are Y-Ba-Cu oxides, Y-Sr-Cu oxides, La-Ba-Cu oxides, La-Sr-Cu oxides and the like. Elements forming these oxide ceramics materials may be partially replaced by other elements. Particularly well-known composition showing superconductivity under the temperature of liquid nitrogen is $YBa_2Cu_3O_x$ ($x = 6.3$ to $6.9$).

Examples of ceramics for forming a flexible ceramics elongated substrate are zirconia, alumina, magnesium oxide, strontium titanate and the like. Within these, known are those containing several percent of yttrium oxide for improving flexibility.

The ceramics elongated substrate is not particularly restricted in configuration, but the same may be provided in the form of a tape or a round wire. In view of strength and flexibility required for the substrate to obtain the elongated body, the thickness of a tape-type substrate is preferably within a range of 30 to 500 $\mu$m while the diameter of a round-wire type substrate is also preferably within a range of 30 to 500 $\mu$m.

A flexible ceramics elongated substrate in the form of a tape, for example, can be advantageously prepared by a zirconia tape having surface roughness Rmax of about 0.3 $\mu$m and rupture strength (at 25° C.) of 11,000 kg/cm$^2$ or an alumina tape having surface roughness of about 0.3 $\mu$m and rupture strength of 3,300 kg/cm$^2$, to be employed in the present invention.

A protective layer employed in a preferred mode of the present invention is formed of ceramics containing a nitride. Such a nitride is selected from AlN, TiN, TiCN, $Si_3N_4$, $Si_{6-z}Al_zO_zN_{8-z}$ ($0 < z \leq 4.3$) and the like. The said nitride $Si_{6-z}Al_zO_zN_{8-z}$ ($0 < z \leq 4.3$) is abbreviated as "sialon", which is a compound obtained by replacing part of silicon by aluminum and part of nitrogen by oxygen within $Si_3N_4$ having $\beta$-type crystals.

The superconducting ceramics elongated body according to the present invention must be obtained in a flexible state. Therefore, in case of employing a tape-type ceramics elongated substrate, for example, the thickness of the obtained superconducting ceramics elongated body is preferably not more than 500 $\mu$m, and more preferably, not more than 55 $\mu$m as a whole. When, on the other hand, a round-wire type ceramics superconducting substrate is employed, for example, the entire diameter of the obtained superconducting ceramics elongated body is preferably selected to be not more than 500 $\mu$m, and more preferably, not more than 55 $\mu$m.

The superconducting ceramics elongated body according to the present invention may be coated with a strong material of a relatively low temperature, e.g., a metal such as titanium or copper, oxide ceramics such as alumina or magnesia, an organic substance such as polyamide, polyimide or polyamide-imide or the like.

The superconducting ceramics elongated body according to the present invention can be flexibly manufactured since the oxide ceramics superconducting layer and the protective layer can be formed while maintaining flexibility of the ceramics elongated substrate. Thus, the superconducting ceramics elongated body can be wound on a reel, for example, to be suitable for practical use.

When the protective layer is provided along the preferred mode, low water or moisture resistance of the oxide ceramics superconducting material forming the oxide ceramics superconducting layer can be compensated by high water or moisture resistance of the ceramics material containing a nitride forming the protective layer. Thus, the range of application of the inventive superconducting ceramics elongated body can be further widened.

In addition to the aforementioned function, the protective layer has a possible effect of increasing mechanical strength of the entire superconducting ceramics elongated body.

The substrate, the superconducting layer and the protective layer forming the inventive superconducting ceramics elongated body, all of which are prepared from ceramics materials, are approximate in thermal expansion coefficient to each other, to be resistant against a thermal shock, for example.

The present invention also provides a method of manufacturing a superconducting ceramics elongated body. According to the inventive manufacturing method, a longitudinally continuous superconducting layer is formed on at least a part of the surface of a flexible ceramics elongated substrate, to provide the superconducting ceramics elongated body.

In a first aspect of the present invention, the manufacturing method comprises a step of applying a solution, which is obtained by adding water to an alcohol solution of a mixture at least containing compounds of either alkoxides or acetylacetonatos of respective metal elements for composing an oxide superconducting material and hydrolyzing the same or by adding water to alcohol solutions of compounds of the respective metal elements for separately hydrolyzing the same and mixing the hydrolyzed alcohol solutions, to at least a part of the surface of a ceramics elongated substrate and a step of heating and firing the coating layer thus formed on the ceramics elongated substrate thereby to provide a superconducting layer. In the first aspect, a sol-gel method is employed. The sol-gel method is adapted to obtain target oxide ceramics by hydrolyzing starting materials of compounds of elements for forming the oxide ceramics. According to this method, the oxide ceramics can be applied to the elongated substrate in an appropriate stage of hydrolysis since its viscosity is increased with progress of the hydrolysis. The first aspect is based on such recognition of the inventor.

In the first aspect of the present invention, therefore, alkoxides or acetylacetonatos of respective metal elements for forming the target oxide superconducting material are first prepared in the form of compounds. Then, a mixture of the alkoxides and/or acetylacetonatos thus prepared is dissolved in alcohol, and water is added to the alcohol solution to hydrolyze the same. Further, dehydration/condensation reaction is caused if necessary. Thus, a sol or gel solution is obtained. The alcohol solution is applied to the surface of the elongated substrate. At this time, preferably adjusted is viscosity which is increased with progress of hydrolysis. The surface of a film thus obtained is heated to obtain an oxide superconducting layer containing the respective metal elements contained in the compounds serving as starting materials.

In this case, the compounds of the respective metal elements, i.e., alcohol solutions containing the alkoxides or acetylacetonatos may be independently hydrolyzed to be thereafter mixed with each other.

The alcohol solution may be applied to at least a part of the surface of the ceramics elongated substrate. It is not necessary to apply the alcohol solution to the entire surface, so far as a longitudinally continuous superconducting layer can be formed. The surface of the ceramics elongated substrate is preferably repeatedly coated with the alcohol solution and heated/fired at least twice, so that no cracking is caused in the superconducting layer after firing.

The superconducting layer obtained by heating/firing in the first aspect of the present invention is excellent in adhesion to the ceramics elongated substrate and has high rupture strength, while no cracking nor disconnection is caused upon bending in prescribed curvature.

As hereinabove described, the inventive method includes the step of previously mixing the solutions containing raw materials before or after hydrolysis in the first aspect, whereby the inventive method can be carried out under a lower temperature of less than 1,000° C., as compared with a method of heating/melting raw materials at a temperature exceeding 1,000° C. to cause solid phase reaction. Further, the raw materials, which are mixed with each other in the form of liquids, are excellent in dispersibility, whereby a homogeneous superconducting layer is obtained as the final product.

The method according to the first aspect of the present invention is adapted to form the superconducting layer by applying the alcohol solution to the ceramics elongated substrate and heating/firing the same, whereby the superconducting ceramics elongated body can be manufactured through simple steps.

In a second aspect of the present invention, the manufacturing method comprises a step of applying superconducting ceramics powder to the surface of a ceramics elongated substrate and a step of heating and . firing the superconducting ceramics powder thus applied, thereby to provide a superconducting layer. In the second aspect of the present invention, the superconducting ceramics powder may be applied to at least a part of the surface of the ceramics elongated substrate. It is not necessary to apply the superconducting ceramics powder to the entire surface of the ceramics elongated substrate, so far as a longitudinally continuous superconducting layer can be formed. In order to ensure continuity of the superconducting layer after firing, fine particles are preferably compression-molded to be adhered to the surface of the ceramics elongated substrate.

In the second aspect of the present invention, heat treatment is performed to sinter the fine particles on the ceramics elongated substrate, thereby to provide a continuous superconducting layer. The fine particles are sintered by the heat treatment to ensure continuity of the superconducting layer, while rupture strength is supplied to the superconducting layer, thereby to prevent occurrence of cracking or disconnection upon bending in prescribed curvature.

It is well known that an oxide superconducting material having perovskite structure is improved in superconductivity by heat treatment in oxygen. When such an oxide superconducting material of perovskite structure is adapted to prepare superconducting ceramics fine particles, therefore, heat treatment is preferably performed under an oxygen gas atmosphere. In this case, oxygen gas partial pressure is preferably 200 to 1,000 mmHg, and more preferably, 760 mmHg. If the oxygen gas partial pressure is lower than 760 mmHg, nitrogen gas may be mixed to substantially equalize the pressure of the mixed gas to the atmospheric pressure.

The method according to the second aspect of the present invention is adapted to form the superconducting layer by applying the superconducting ceramics fine particles to the ceramics elongated substrate and heating/sintering the same, whereby the superconducting ceramics elongated body can be manufactured through simple steps.

In a third aspect of the present invention, the manufacturing method comprises a step of independently vaporizing simple substances or compounds containing respective metal elements for composing an oxide superconducting material under presence of oxygen ions and a step of depositing the vaporized simple substances or compounds on a ceramics elongated substrate to form a superconducting layer. In the method according to the third aspect of the present invention, the simple substances or compounds containing the respective metal elements for composing the oxide superconducting material are so independently vaporized that the elements, which are in the same ratios as the composition ratios of the simple substances or the compounds, reach the surface of the ceramics elongated substrate at desired rates respectively. When the metal elements are employed in the form of simple substances and vaporized under presence of oxygen ions, oxygen is supplied in formation of the superconducting layer, to provide a homogeneous oxide superconducting layer. In the case of compounds containing the metal elements such as compounds containing oxygen, i.e., oxides, for example, on the other hand, even if the compounds are deoxidized by decomposition upon vaporization, no oxygen deficiency is caused since the compounds are vaporized under presence of oxygen ions to be supplied with oxygen, thereby to provide a homogeneous oxide superconducting layer having no oxygen deficiency.

In the method according to the third aspect of the present invention, the materials for forming the superconducting layer may be in the form of either simple substances or compounds, so far as the same contain the metal elements for composing the oxide superconducting material. In the case of the compounds, the materials may be prepared from chlorides, nitrides, carbides, sulfides or fluorides. Within these, oxides and carbooxides, particularly oxides are preferable. The simple substances or the compounds containing the metal elements can be appropriately selected in response to desired characteristics of the superconducting layer.

In the third aspect of the present invention, the amount of oxygen ions required to obtain a superconducting layer having excellent superconductivity depends on the materials employed as evaporation sources, i.e., either the simple substances or the compounds, as well as the contents of oxygen in the case of the compounds. An appropriate amount of oxygen ions is further varied with vapor pressures of the materials serving as evaporation sources, the degrees of decomposability of the compounds and the like. Thus, the amount of oxygen ions can be appropriately selected in response to the materials employed as the evaporation sources.

Oxygen ions are thus applied with evaporation to supply oxygen while vaporizing the elements in the same ratios as the composition ratios of the simple substances or compounds respectively toward the substrate, thereby to obtain a superconducting layer which is homogeneous in composition and excellent in characteristic. This is because the simple substances or compounds can be vaporized in desired ratios by setting heating conditions in response to the materials even if the simple substances or compounds, which are employed as evaporation sources, are different in vapor pressure from each other, thereby to control the entire composition of the evaporated substances. Further, even if deoxidation is caused by decomposition of the compounds serving as the evaporation sources in the process of evaporation, oxygen is supplied by application of the oxygen ions. Thus, even if substances containing oxygen are employed as the evaporation sources, the superconducting layer will not deviate in composition from the evaporation sources and no deficiency of oxygen is caused in the superconducting layer. Thus, a superconducting layer having homogeneous composition can be formed with excellent characteristics.

When simple substances are employed as evaporation sources, a superconducting layer of excellent characteristics can be formed by simply independently vaporizing the respective simple substances, due to application of oxygen ions. In order to obtain a more excellent oxide superconducting layer, however, it is preferable to ionize the simple substances, which are independently vaporized, by an ionizer. Such vaporized simple substances can be ionized by various methods, such as ion plating, a direct current process of forming plasma around a substrate serving as a cathode and passing vaporized evaporation sources through the plasma, a high-frequency process of performing ionization by providing a high-frequency coil between a substrate and evaporation sources, a cluster ion beam method of ionizing vaporized evaporation sources by employing an ionizing grid and a hot cathode, a hot cathode method and the like. In this case, the evaporation sources are not restricted to simple substances but compounds can also be employed, while an oxygen ion source is not necessarily required since oxygen ions are generated upon introduction of oxygen gas into a chamber. However, the aforementioned method of applying oxygen ions, which can continuously supply oxygen ions, is preferable in order to form an oxide superconducting layer having good characteristics.

Although the simple substances or compounds are vaporized by vacuum evaporation in the above, an oxide superconducting layer may be formed on a substrate by applying oxygen ions while vaporizing simple substances or compounds containing prescribed elements by various physical vapor phase deposition (PVD) methods such as molecular beam epitaxy, sputtering and ion plating.

In the method according to the third aspect of the present invention, the superconducting layer is formed under presence of oxygen ions, whereby oxygen is sufficiently supplied to cause no oxygen deficiency. Thus, an oxide superconducting layer having homogeneous composition can be formed.

In a fourth aspect of the present invention, the manufacturing method comprises a step of dissolving oxides for composing superconducting ceramics in a solution of at least one fluoride having a melting point lower than those of the oxides, a step of reacting the oxides in the fluoride solution to form a composite oxide composing the superconducting ceramics and a step of bringing the fluoride solution into contact with the surface of a ceramics elongated substrate while reducing temperature distribution of the fluoride solution toward the surface of the ceramics elongated substrate to deposit the composite oxide on the same, thereby to form a superconducting layer. In the fourth aspect of the present invention, the oxides for composing the superconducting ceramics are generally prepared by independent oxides of respective metal elements for forming the superconducting ceramics. However, oxides each containing two or more metal elements are also available. Further, it is also possible to employ a composite oxide containing all of the metal elements and being different from the superconducting ceramics only in composition ratio. If the oxide superconducting ceramics contains elements for forming anions other than oxygen, compounds containing the said elements may be employed as raw materials with other oxides.

Such oxides serving as raw materials are dissolved in a solution of at least one fluoride having a melting point lower than those of the oxides. By such dissolution in the fluoride solution, the oxides are rendered reactive with each other, to be capable of forming a composite oxide composing superconducting ceramics. Thus, the composite oxide can be formed at a temperature lower than melting points of the oxides, by utilizing such a solution of the fluoride.

The fluoride can be arbitrarily selected so far as the same exerts no bad influence on superconductivity etc. of the formed superconducting ceramics. Such a fluoride can be selected from fluorides of metal elements for composing superconducting ceramics, for example. In order to reduce influence exerted on composition of the superconducting ceramics, the mixing rates of the fluorides of the respective metal elements are preferably equal to those of the respective metal elements contained in the superconducting ceramics. However, the fluoride can be prepared by an element other than those for composing the superconducting ceramics. For example, fluorides of lanthanoids are generally available in the case of the aforementioned Y-Ba-Cu oxides etc.

The fluoride solution, in which the raw-material oxides are dissolved, is brought into contact with the surface of the ceramics elongated substrate, and set in temperature distribution reduced toward the surface of the ceramics elongated substrate. Due to such a temperature gradient of the fluoride solution, the composite oxide formed by reaction of the raw-material oxides enters a saturated state of dissolution on the surface of the ceramics elongated substrate to be deposited on the said surface, thereby to form a superconducting layer.

The superconducting layer formed in the fourth aspect of the present invention does not necessarily cover the entire surface of the ceramics elongated substrate, but may only be longitudinally continuous.

The composite oxide deposited as the superconducting layer is not necessarily identical in composition rate to the oxides dissolved in the fluoride solution. For example, when the aforementioned superconducting ceramics composed of $YBa_2Cu_3O_x$ is deposited, the ratio Y:Ba:Cu is equal to 1:2:3, while $YBa_2Cu_3O_x$ can be deposited on the ceramics elongated substrate as primary crystals even if the contents of $YO_{1.5}$, Ba and CuO present in the fluoride solution are 0.8 to 1.2 mols, 1.3 to 2.3 mos and 2.3 to 3.3 mols respectively.

Oxides of raw materials corresponding to those forming the deposited composite oxide are continuously supplied into the fluoride solution to be dissolved in the same, thereby to continuously form a superconducting layer of the composite oxide, which is in prescribed composition, on the ceramics elongated substrate.

When the superconducting ceramics contains an oxide such as CuO, which is easily decomposed under a high temperature to lose oxygen, the superconducting layer is preferably heated under an oxygen atmosphere. The superconducting layer can be provided with a prescribed amount of oxygen by such heating under the oxygen atmosphere. Oxygen gas partial pressure is preferably 200 to 1,000 mmHg, and more preferably, 760 mmHg. If the oxygen gas partial pressure is lower than 760 mmHg, nitrogen gas may be mixed to substantially equalize the pressure of the mixed gas to the atmospheric pressure In the method according to the fourth aspect of the present invention, the raw-material oxides are molten under a low temperature through use of the fluoride solution, whereby superconducting ceramics of homogeneous composition can be obtained while causing no problem of volatilization of volatile elements.

In a fifth aspect of the present invention, the manufacturing method comprises a step of mixing fluorides of cations for composing oxide superconducting ceramics so that the respective cations are equal in ratio to those contained in the superconducting ceramics, a step of longitudinally continuously applying the mixture to at least a part of the surface of a flexible ceramics elongated substrate to form a coating layer and a step of heating the coating layer under an oxygen gas atmosphere to replace fluorine contained in fluorides forming the coating layer by oxygen thereby to convert the composition of the coating layer into that of superconducting ceramics.

In the fifth aspect of the present invention, the cations for composing the oxide superconducting ceramics are generally prepared from metal elements contained in the oxide superconducting ceramics. Such fluorides are employed as raw materials since fluorides can be generally molten under a relatively low temperature. Due to such melting under a low temperature, the cations can be homogeneously mixed while volatilization of volatile elements can be restricted to arbitrarily control the composition ratio.

The fluorides of the said cations are so mixed that the rates of the respective cations are equal to those of cations contained in the superconducting ceramics. In case of the aforementioned superconducting ceramics composed of $YBa_2Cu_3O_x$, for example, respective fluorides are so mixed that the mole ratio of $YF_3:BaF_2:CuF_2$ is equal to 1:2:3.

The mixture may be obtained by mixing fine particles of respective fluorides and thereafter heating and melting the same, or by simply mixing the fine particles. Thus, the mixture may be applied to the ceramics elongated substrate in a state of a molten liquid or fine particles. In the latter case, the fine particles are heated and molten on the surface of the ceramics elongated substrate after application.

The mixture is not adapted to cover the entire surface of the elongated substrate, but may be applied to at least a part of its surface so that the coating layer is continuous in the longitudinal direction.

In the method according to the fifth aspect of the present invention, heat treatment is performed under the oxygen gas atmosphere in order to replace fluorine contained in the fluorides forming the coating layer by oxygen. Oxygen gas partial pressure is preferably 200 to 1,000 mmHg, and more preferably, 760 mmHg. When the oxygen gas partial pressure is lower than 760 mmHg, nitrogen gas may be mixed to substantially equalize the pressure of the mixed gas to the atmospheric pressure.

Among oxide superconducting ceramics materials, known is that containing fluorine. Therefore, fluorine contained in the fluorides may not be entirely replaced by oxygen, but may partially remain intact. Similarly, when the oxide superconducting ceramics contains anions other than oxygen and fluorine, compounds containing such anions may be mixed into the mixture of fluorides, to be left in the final superconducting ceramics forming the coating layer.

In the method according to the fifth aspect of the present invention, the fluorides are employed as raw materials to be molten under a low temperature, whereby superconducting ceramics of homogeneous composition can be obtained.

These and other objects, features, aspects and advantages of the present invention will become more apparent from the following detailed description of the present invention when taken in conjunction with the accompanying drawings.

DESCRIPTION OF THE PREFERRED EMBODIMENTS

Description is now made on an embodiment of a first aspect of the manufacturing method according to the present invention.

Example 1-1

An alcohol solution containing alkoxides of respective metal elements for composing an oxide superconducting material was prepared by an isopropanol solution obtained by mixing 1 mol of yttrium-tri-3-ethyl-pentoxide:

2 mols of barium-tri-3-ethyl-pentoxide:

and 3 mols of copper-tri-3-ethyl-3-pentoxide:

A small amount of acetylacetone was further added to the mixed solution, which was then stirred mixed under reflux at a temperature of 83° C. Thereafter water diluted by alcohol was added to the mixed solution to hydroyze the same. At this time, water was added by an amount corresponding to 1.2 equivalent in mole ratio to each alkoxide. The mixed solution was further stirred under a temperature of 83° C. for two hours, and then stood for cooling to the room temperature.

A sol solution thus obtained was left until its viscosity was 20 poises.

Figure 1:
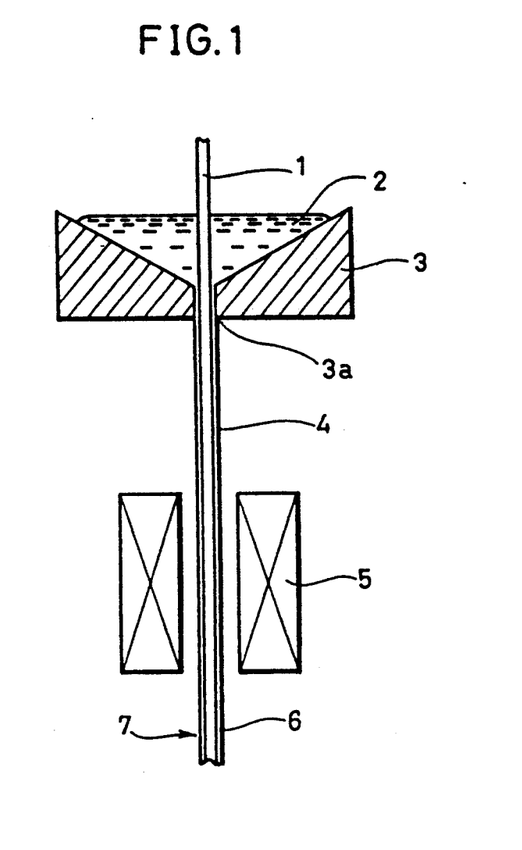
FIG. 1 is a block diagram showing an apparatus for illustrating an embodiment of a first aspect of the manufacturing method according to the present invention.

This sol solution was employed to manufacture a superconducting ceramics elongated body according to the method of the present invention by an apparatus shown in FIG. 1.

FIG. 1 is a block diagram showing an apparatus for illustrating the embodiment of the first aspect of the manufacturing method according to the present invention. The apparatus shown in FIG. 1 is formed by a crucible 3 containing a sol solution 2 and a heating furnace 5. A hole 3a is defined in a central portion of the crucible 3, to pass a ceramics elongated substrate 1.

First, the sol solution 2 prepared in the aforementioned manner was introduced into the crucible 3. A zirconia tape of 50 μm in thickness and 3 mm in width was employed as the ceramics elongated substrate 1, which was introduced into the crucible 3 from above and passed through the sol solution 2, to be drawn out through the hole 3a of the crucible 3. The ceramics elongated substrate 1 thus extracted from the hole 3a of the crucible 3 was provided on its surface with a coating layer 4 by the sol solution 2. The thickness of the coating layer 4 was about 1 μm.

The ceramics elongated substrate 1 thus provided with the coating layer 4 was then introduced into the downwardly provided heating furnace 5, to be heated up to 800° C. The ceramics elongated substrate 1 was then drawn out in the form of a tape-type linear body from a lower portion of the heating furnace, to provide a superconducting ceramics elongated body 7 which was formed on its surface with a superconducting layer 6 of a Y-Ba-Cu-O oxide.

Such coating and firing were repeated several times, to obtain the superconducting ceramics elongated body 7 which was provided with the superconducting layer 6 of about 5 μm in thickness.

The superconducting layer of the superconducting ceramics elongated body obtained in the aforementioned manner was analyzed by X-ray diffraction, to recognize that the layer was in $K_2NiF_4$ type layer perovskite structure, which is typical crystal structure of high-temperature superconducting ceramics. This superconducting ceramics layer superconducted at a temperature exceeding 77K, the boiling point of liquid nitrogen. Even if the superconducting ceramics layer was bent in a radius of curvature of 30 cm, no breakage of the ceramics elongated body nor cracking in the superconducting layer was caused, while superconductivity of the elongated body was not damaged.

Figure 2A:
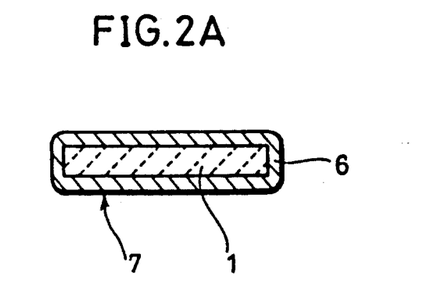
FIG. 2A is a sectional view showing a first embodiment of the superconducting ceramics elongated body according to the present invention.
Figure 2B:
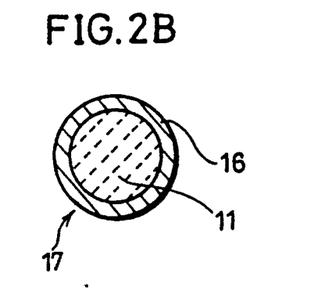
FIG. 2B is a sectional view showing a second embodiment of the superconducting ceramics elongated body according to the present invention.

FIG. 2A is a sectional view showing the tape-type superconducting ceramics elongated body 7 obtained in the aforementioned manner. The superconducting layer 6 is provided on the outer peripheral surface of the tape-type ceramics elongated substrate 1. Although the superconducting ceramics elongated body 7 was provided in the form of a tape in this Example, another type of superconducting ceramics elongated body 17 may be prepared by forming a superconducting layer 16 on the surface of a ceramics elongated substrate 11 which is in the form of a round wire, as shown in FIG. 2B.

Example 1-2

A sol solution was prepared similarly to Example 1-1. A tape-type ceramics elongated substrate was prepared by a zirconia tape similarly to Example 1-1 and dipped in the sol solution, to be provided with a coating layer of about 1 μm in thickness. The ceramics elongated substrate was taken out from the solution and heated up to 800° C., to be provided on its surface with a superconducting layer of a Y-Ba-Cu-O oxide. Such dipping and heating were repeated several times, to finally obtain a superconducting ceramics elongated body provided with a superconducting layer of 5 μm in thickness.

The superconducting ceramics elongated body superconducted at a temperature exceeding 77K, the boiling point of liquid nitrogen, while no cracking nor disconnection was caused even if the same was bent in a radius of curvature of about 30 cm.

Description is now made on an embodiment of a second aspect of the manufacturing method according to the present invention.

Example 2-1

Fine particles of superconducting ceramics were first prepared as follows: Raw materials were prepared from $Y_2O_3$ powder, $BaCO_3$ powder and CuO powder, which were mixed and compression-molded under pressure of 100 atm. at the room temperature under the atmosphere. A compression-molded body thus obtained was preliminarily sintered in an atmosphere containing 760 mmHg of oxygen gas at 940° C. for 24 hours. A preliminarily sintered ceramics body thus obtained was pulverized in a ball mill to be 0.5 to 1 μm in particle size.

The pulverized fine particles were again compression-molded to repeat preliminary sintering. Such a series of steps were repeated until the ceramics powder was in composition of $YBa_2Cu_3O_{6.8}$ in X-ray diffraction. The most preferable condition for the gas atmosphere in preliminary sintering is oxygen gas partial pressure of 760 mmHg, as hereinabove described. However, the oxygen gas partial pressure may be within a range of 200 to 1,000 mmHg. If the oxygen partial pressure is lower than 760 mmHg, nitrogen gas may be mixed to equalize the pressure of the mixed gas to the atmospheric pressure.

Figure 3:
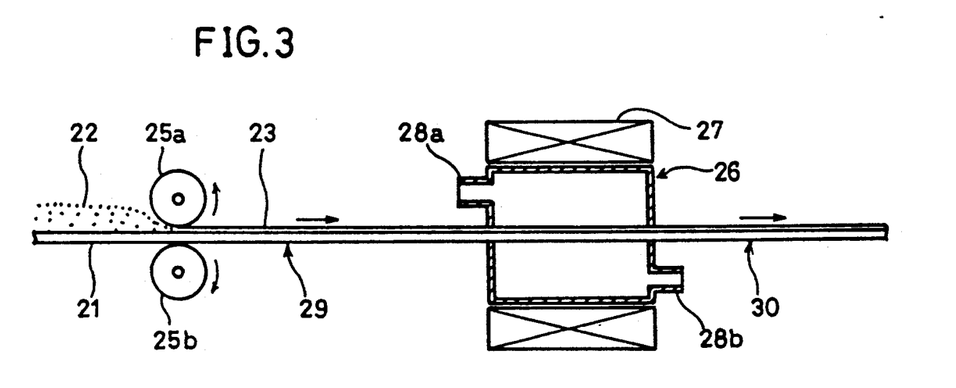
FIG. 3 is a block diagram showing an apparatus for illustrating an embodiment of a second aspect of the manufacturing method according to the present invention.

The superconducting ceramics powder obtained in the aforementioned manner was employed to manufacture a superconducting ceramics elongated body according to the present invention, by an apparatus shown in FIG. 3. Referring to FIG. 3, a ceramics elongated substrate 21 was inserted between rollers 25a and 25b and rightwardly moved in FIG. 3, to pass through a heating furnace 26. The ceramics elongated substrate 21 was prepared by a zirconia-tape type wire rod of 3 mm in width and 50 μm in thickness. Superconducting ceramics fine particles 22 were supplied to the upper surface of the ceramics elongated substrate 21 and rolled by the rollers 25a and 25b, to define a layer of 5 μm in thickness by compression molding on the ceramics elongated substrate 21. Thus, a compression-molded layer 23 was formed by the superconducting ceramics fine particles 22 on the ceramics elongated substrate 21.

The ceramics elongated substrate 21 thus provided with the compression-molded layer 23 was introduced into the heating furnace 26, in the form of an elongated body 29 coated with the fine particles. A heater 27 was provided around the heating furnace 26 to heat the same. Further, the heating furnace 26 was provided with an oxygen gas supply port 28a and an oxygen gas exhaust port 28b. Oxygen gas was supplied from the oxygen gas supply port 28a and exhausted from the oxygen gas exhaust port 28b, to provide an oxygen gas atmosphere in the heating furnace 26. The pressure of the oxygen gas was controlled to be identical to the atmospheric pressure of 760 mmHg.

It took 30 minutes for the elongated body 29, coated with the fine particles, to pass through the heating furnace 26. The compression-molded layer 23 was sintered in the heating furnace 26, to provide a superconducting layer 24. The ceramics elongated substrate 21 provided with the superconducting layer 24 on its one surface was delivered as a superconducting ceramics elongated body 30.

The temperature-resistance characteristic of the superconducting ceramics elongated body obtained in the aforementioned manner was measured to confirm that it superconducted at a temperature exceeding 77K, the boiling point of liquid nitrogen.

It has been also confirmed that no cracking nor disconnection was caused even if the superconducting ceramics elongated body thus obtained was bent in a radius of curvature of 30 cm, while its superconductivity was not damaged. However, cracking or disconnection was caused by bending in the elongated body 29 coated with the fine particles before introduction into the heating furnace 26. This suggests that the sintering step contributed to improvement in strength of the superconducting layer against bending.

Example 2-2

Figure 4:
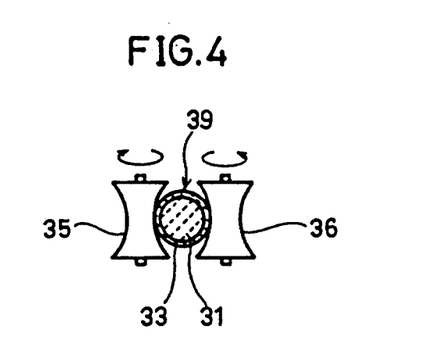
FIG. 4 is a front elevational view showing an apparatus for illustrating another embodiment of the second aspect of the manufacturing method according to the present invention.

Superconducting ceramics fine particles were prepared similarly to Example 2-1 and compression-molded by rolling as shown in FIG. 4, to be applied to the surface of a zirconia wire of 0.1 mm in diameter.

Referring to FIG. 4, numeral 31 indicates a ceramics elongated substrate in the form of a round wire and numeral 33 indicates a compression-molded layer. The superconducting ceramics fine particles were supplied between rollers 35 and 36 and compressed by the same to form the compression-molded layer 33, thereby to obtain an elongated body 39 coated with the fine particles.

Figure 5:
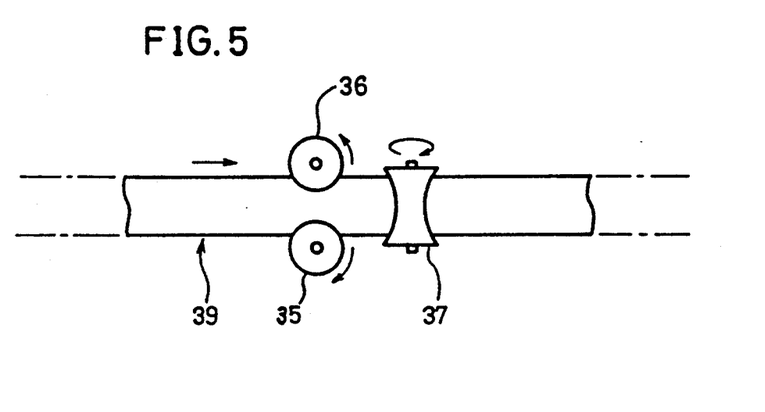
FIG. 5 is a plan view showing the apparatus for illustrating the embodiment of the second aspect of the manufacturing method according to the present invention shown in FIG. 4.

FIG. 5 is a top plan view showing the rollers 35 and 36. In addition to the pair of rollers 35 and 36, other rollers are preferably provided at various angles with respect to the ceramics elongated substrate 31, in order to uniformly compress the periphery thereof. FIG. 5 illustrates an exemplary roller 37, which is provided perpendicularly to the rollers 35 and 36. The roller 37 forms a counterpart to another roller (not shown), to compress the peripheral surface of the elongated body 39 coated with the fine particles as well as to deliver the same. The elongated body 39 coated with the fine particles may be supplied in a twisted manner to pass through a plurality of rollers, so that its peripheral surface is uniformly compressed.

The compression-molded layer 33 of about 3 $\mu$m in thickness was thus formed by the superconducting ceramics fine particles on the ceramics elongated substrate 31, which was then introduced into a heating furnace under an oxygen atmosphere similarly to that shown in FIG. 3 to sinter the compression-molded layer 33 for providing a superconducting layer, thereby to manufacture a superconducting ceramics elongated body.

The superconducting ceramics elongated body obtained in the aforementioned manner superconducted at a temperature exceeding 77K, the boiling point of liquid nitrogen, while no cracking nor disconnection was caused even if the elongated body was bent in a radius of curvature of about 30 cm.

Description is now made on an embodiment of a third aspect of the manufacturing method according to the present invention.

Figure 6:
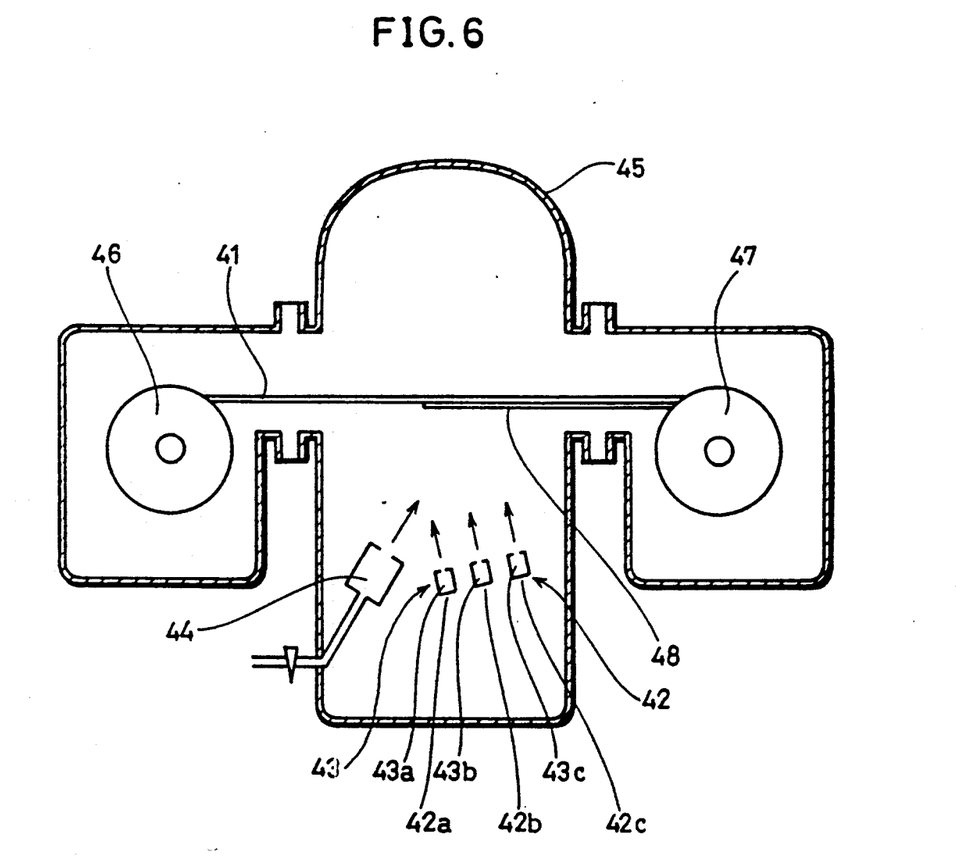
FIG. 6 is a block diagram showing an apparatus for illustrating an embodiment of a third aspect of the manufacturing method according to the present invention.

FIG. 6 is a block diagram showing an exemplary apparatus employed for the method according to the third aspect of the present invention. A ceramics elongated substrate 41 is delivered from a supply reel 46 in a vacuum chamber 45. Upon formation of a superconducting layer 48, the ceramics elongated substrate 41 is wound on a take-up reel 47. Crucibles 42 containing simple substances or compounds 43 are provided in the vacuum chamber 45, which is decompressed at a high degree of vacuum. The crucibles 42 are formed by a plurality of independent crucibles 42a, 42b and 42c, which contain simple substances or compounds 43a, 43b and 43c respectively. The respective simple substances or compounds 43a, 43b and 43c contained in the crucibles 42a, 42b and 42c are separately heated to be independently vaporized toward the ceramics elongated substrate 41. The simple substances or compounds 43a, 43b and 43c are independently heated under conditions responsive to vapor pressures etc. thereof, so as to control the entire composition of the evaporated simple substances or compounds 43 and that of a superconducting layer formed on the ceramics elongated substrate 41. Heating conditions etc. can be appropriately selected in response to vapor pressures, speeds of growth, film thickness etc. of the simple substances or compounds 43 contained in the crucibles 42, while a heating method can be selected from various methods such as resistance heating, electron beam heating, induction heating and the like. The crucibles 42 may be arranged in response to the number of elements required for composing a desired superconducting material.

The simple substances or compounds 43 are evaporated toward the ceramics elongated substrate 41 in the apparatus having the aforementioned structure. In order to uniformly form a superconducting layer 48 containing an appropriate amount of oxygen and having excellent characteristics, oxygen ions are applied to the ceramics elongated substrate 41 with the aforementioned evaporation, thereby to produce a desired oxide superconducting material. Application of oxygen ions can.. be performed by ionizing supplied oxygen molecules by an oxygen ion source 44 through a method such as electric field application and applying the ions to the ceramics elongated substrate 41.

Examples of the third aspect are now described.

Example 3-1

The vacuum evaporation apparatus shown in FIG. 6 was employed, to introduce $La_2O_3$ in the crucible 42a, BaO in the crucible 42b and CuO in the crucible 42c respectively in the vacuum chamber 45, which was then decompressed into a high vacuum state.

The crucibles 42a, 42b and 42c were separately heated to independently adjust atmospheric pressures of the respective materials. The temperature of the crucible 42a containing $La_2O_3$ was controlled in a range of 1,800 to 2,000K and that of the crucible 42b containing BaO was controlled in the range of 1,300 to 1,500K while the temperature of the crucible 42c containing CuO was controlled in a range of 1,000 to 1,300K.

The ceramics elongated body 41 was prepared by a tape-type wire rod of zirconia of 3 mm in width and 50 $\mu$m in thickness. The ceramics elongated substrate 41 was delivered from the supply reel 46.

The respective materials, which were contained in the crucibles 42a, 42b and 42c as evaporation sources, were independently evaporated toward the ceramics elongated substrate 41, while oxygen ions were applied to the ceramics elongated substrate 41 under current density of 10 $A/m^2$ at the maximum. Thus, an oxide superconducting layer 40 of about 3 $\mu$m in thickness was formed on the ceramics elongated substrate 41. The ceramics elongated substrate 41 provided with the superconducting layer 48 was wound on the take-up reel 47.

The temperature-resistance characteristic of the superconducting ceramics elongated body obtained in the aforementioned manner was measured to confirm that it superconducted at a temperature exceeding 77K, the boiling point of liquid nitrogen.

It has also been confirmed that no cracking nor disconnection was caused even if the superconducting ceramics elongated body obtained in the aforementioned manner was bent in a radius of curvature of 30 cm, while its superconductivity was not damaged.

Example 3-2

An apparatus similar to that of Example 3-1 was employed to introduce La in the crucible 42a, Ba in the crucible 42b and Cu in the crucible 42c respectively.

Also similarly to Example 3-1, the crucibles 42a, 42b and 42c were independently heated/temperature-controlled. The temperature of the crucible 42a containing La was controlled in a range of 1,400 to 1,600K and that of the crucible 42b containing Ba was controlled in a range of 500 to 700K, while the temperature of the crucible 42c containing Cu was controlled in a range of 1,100 to 1,200K.

The ceramics elongated substrate 41 was prepared by a material which was similar to that in Example 3-1.

The materials in the crucibles 42a, 42b, and 42c were independently evaporated while applying oxygen ions from the oxygen ion source 44 toward the ceramics elongated substrate 41 similarly to Example 3-1, thereby to form an oxide superconducting layer 48 on the ceramics elongated substrate 41.

The superconducting ceramics elongated body obtained in the aforementioned manner superconducted at a temperature exceeding 77K, the boiling point of liquid nitrogen, while no cracking nor disconnection was caused even if the superconducting ceramics elongated body was bent in a radius of curvature of about 30 cm.

Characteristics of the oxide superconducting layers obtained in Examples 3-1 and 3-2 were examined by an electron microscope and an elementary analyzer, to confirm that both of the oxide superconducting layers were homogeneous in composition. Further, it has been presumed through analysis of crystal structure by an X-ray diffractometer that the oxide superconducting layers had layer perovskite structure, which is typical crystal structure of a high-temperature superconducting material.

Description is now made on an embodiment of a fourth aspect of the manufacturing method according to the present invention.

Figure 7:
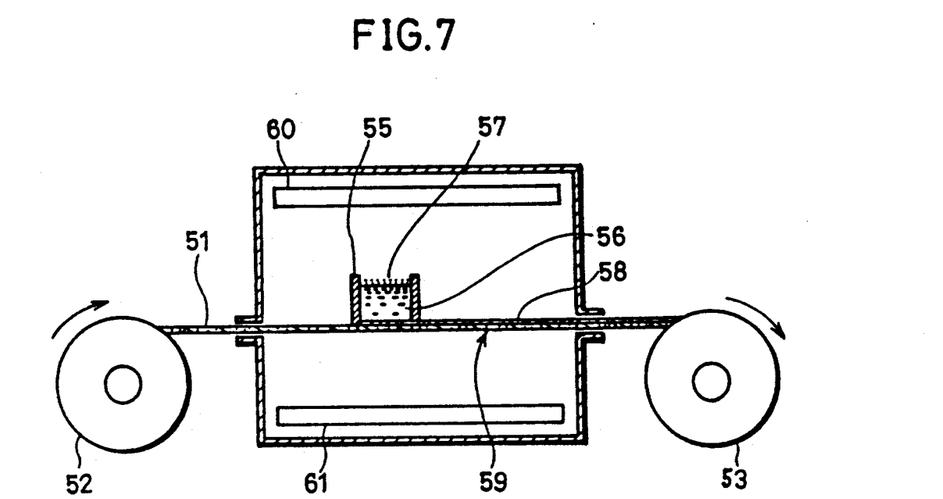
FIG. 7 is a block diagram showing an apparatus for illustrating an embodiment of a fourth aspect of the manufacturing method according to the present invention.
Figure 8:
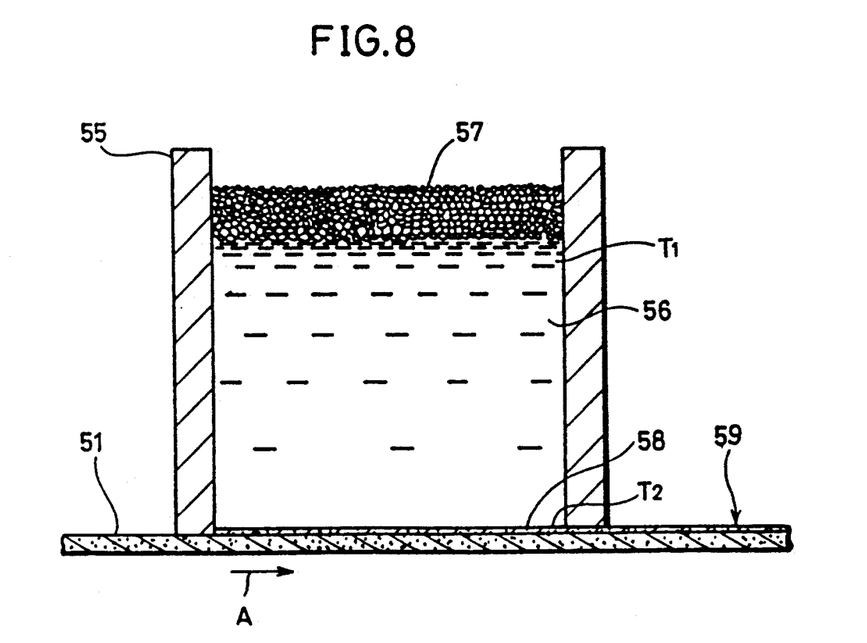
FIG. 8 is an enlarged sectional view showing a crucible of the apparatus shown in FIG. 7.

FIG. 7 is a block diagram showing an apparatus for illustrating an embodiment of the fourth aspect of the method according to the present invention. FIG. 8 is an enlarged sectional view of a crucible 55 shown in FIG. 7. A ceramics elongated substrate 51 supplied from a supply reel 52 passes through an oxygen atmosphere furnace 54, to be wound on a take-up reel 53. Within the oxygen atmosphere furnace 54, the crucible 55, containing a fluoride solution 56, is set on the ceramics elongated substrate 1. Raw-material oxides 57 are supplied on the fluoride solution 56. As shown in FIG. 8, an upper portion of the fluoride solution 56 is at a temperature $T_1$ while its lower portion, which is in contact with the surface of the ceramics elongated substrate 51, is at a temperature $T_2$. Such a temperature gradient in the fluoride solution 56 is controlled by heaters 60 and 61, which are provided in upper and lower parts of the oxygen atmosphere furnace 54.

Through use of such an apparatus, a superconducting layer 58 was formed on the ceramics elongated substrate 51 by a superconducting ceramics material composed of $YBa_2Cu_3O_x$ ($x = 6.3$ to 6.9). The raw-material oxides were prepared by mixed powder of oxides containing 1 mol of $YO_{1.5}$, 2 mols of $BaO$ and 3 mols of $CuO$, and the fluoride solution was prepared by a fluoride containing 1 mol of $YF_3$, 2 mols of $BaF_2$ and 3 mols of $CuF_2$. A fluoride mixed in such a ratio is generally molten in a temperature range of 1,300° to 1,150° C., while the fluoride was molten at 1,200° C. in this Example.

The mixed powder of the above oxides was supplied in the form of the raw-material oxides 57 on the fluoride solution 56. The temperature at the bottom portion of the crucible 55 was 1,100° C., and the heaters 60 and 61 were so controlled that the temperature $T_1$ at the upper portion of the crucible 55 was 1,200° C. and the temperature $T_2$ at the lower portion, being in contact with the ceramics elongated substrate 51, was 1,150° C. It is to be noted that, when the temperature $T_1$ is changed within a range of 1,300° to 1,150° C., the temperature at the bottom portion of the crucible 55 is preferably changed in a range of 1,200° to 980° C. responsively.

The ceramics elongated substrate 51 was prepared by a zirconia tape of 3 mm in width and 50 μm in thickness. Although the crucible 55 was made of platinum in this Example, a gold one is also employable. Oxygen gas partial pressure in the oxygen atmosphere furnace 54 was controlled to be 760 mmHg.

Referring to FIG. 8, the raw-material oxides 57 supplied on the fluoride solution 56 were dissolved in the fluoride solution 56. The process of such dissolution was not clear but it can be presumed that a composite oxide having a low melting point was formed by the raw-material oxides 57 and dissolved in the fluoride solution 56. The raw-material oxides 57 supplied to the fluoride solution 56 were rendered reactive between themselves, to produce a composite oxide composing a superconducting ceramics material. The fluoride solution 56 was set in the temperature gradient of $T_1$ to $T_2$, so that the surface of the ceramics elongated substrate 51 was under the temperature $T_2$. Therefore, the composite oxide forming the superconducting ceramics material was saturated in the vicinity of the ceramics elongated substrate 51 to be deposited on the same, thereby to form the superconducting layer 58.

Such a superconducting layer 58 was formed on the ceramics elongated substrate 51, which was continuously moved in a direction A. Thus, the superconducting layer 58 was continuously formed on the ceramics elongated substrate 51 and delivered as a superconducting ceramics elongated body 59, to be wound on the take-up reel 53.

When the superconducting layer 58 was thus deposited in the lower portion of the crucible 55, new raw-material oxides 57 were dissolved in the fluoride solution 56 by an amount corresponding to that of such deposition. Thus, the raw-material oxides 57 were newly dissolved in the fluoride solution 56 by the amount corresponding to the deposited superconducting layer 58, so that the oxides were regularly present in a constant amount in the fluoride solution 56. Such process was repeated to form the superconducting layer 58 on the ceramics elongated substrate 51.

The temperature-resistance characteristic of the superconducting ceramics elongated body obtained in the above manner was measured to recognize that it superconducted at a temperature exceeding 77K, the boiling point of liquid nitrogen.

Further, no disconnection was caused even if the superconducting ceramics elongated body was bent in a radius of curvature of 30 cm while its superconductivity was not damaged. Thus, it has been confirmed that the superconducting ceramics elongated body was highly practicable.

Although the superconducting layer was formed under the oxygen atmosphere in the above Example, the fourth aspect of the present invention is not restricted to formation of the superconducting layer under such an oxygen atmosphere.

The fluoride solution 56 may be slightly adhered to the superconducting layer 58 deposited on the surface of the ceramics elongated substrate 51. However, such adhesion causes no problem so far as the solution is prepared by a fluoride which exerts no bad influence on the superconducting ceramics material, as in the Example. Further, the fluoride adhered to the superconducting layer can be converted into an oxide under an oxygen atmosphere, as in the Example.

Description is now made on an embodiment of a fifth aspect of the manufacturing method according to the present invention.

Figure 9:
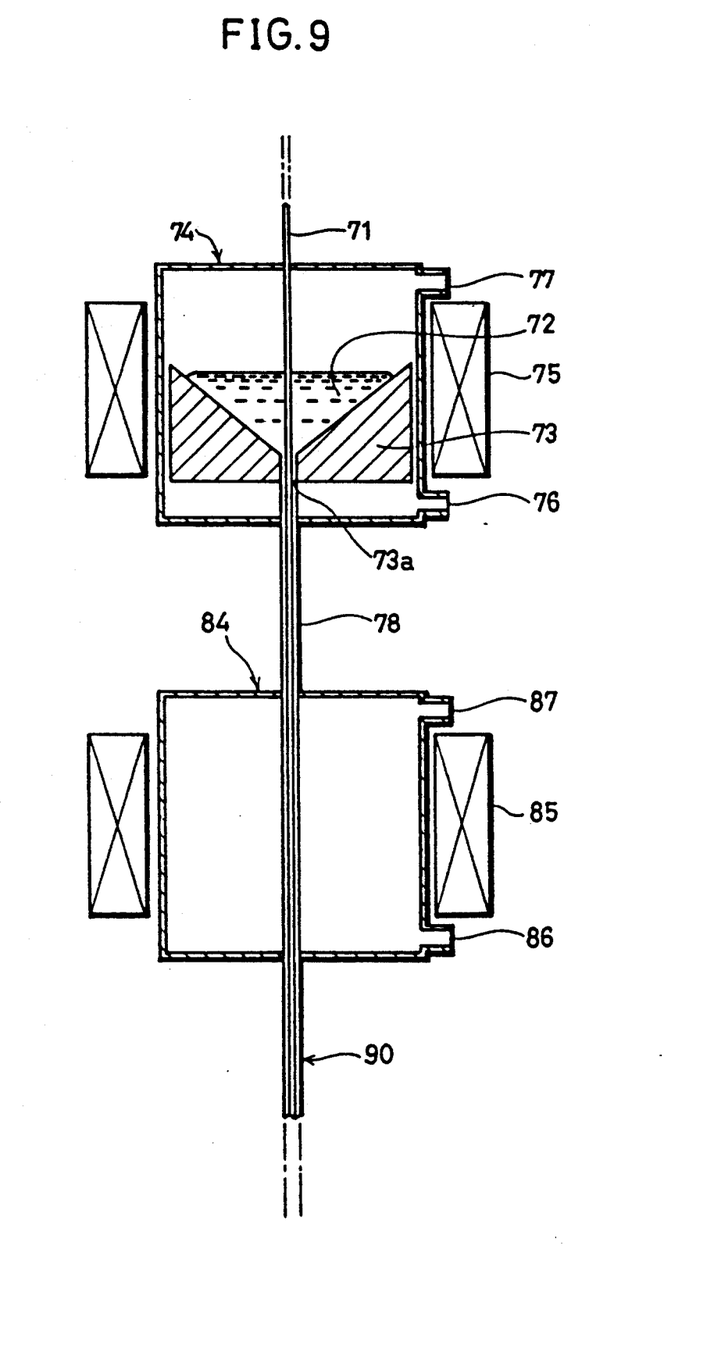
FIG. 9 is a block diagram showing an apparatus for illustrating an embodiment of a fifth aspect of the manufacturing method according to the present invention.

FIG. 9 is a block diagram showing an apparatus for illustrating the method according to the fifth aspect of the present invention. The apparatus shown in FIG. 9 is formed by a melting furnace 74 and an oxygen gas atmosphere furnace 84, and a gold crucible 73 is provided in the melting furnace 74. A fluoride solution 72 prepared by a mixture is contained in the gold crucible 73. A hole 73a is defined in a central portion of the gold crucible 73, so that a ceramics elongated substrate 71 passes through the hole 73a.

A heater 75 for heating the fluoride solution 72 is provided around the melting furnace 74. The melting furnace 74 is provided with an inert gas supply port 76 and an inert gas exhaust port 77.

Another heater 85 is provided around the oxygen gas atmosphere furnace 84 to control the temperature in the furnace. The oxygen gas atmosphere furnace 84 is provided with an oxygen gas supply port 86 and an oxygen gas exhaust port 87.

A mixture of fluorides, containing 1 mol of $YF_3$, 2 mols of $BaF_2$ and 3 mols of $CuF_2$ was introduced into the gold crucible 73 and heated by the heater 75 to be molten at a temperature of 950° C., thereby to provide the fluoride solution 72. Viscosity of the fluoride solution 72 was 10 to 100 cps. Inert gas was prepared by argon gas, which was supplied from the inert gas supply port 76 and exhausted from the inert gas exhaust port 77, to provide an argon gas atmosphere in the melting furnace 74.

A zirconia tape of 50 $\mu$m in thickness was employed as the ceramics elongated substrate 71, which was introduced into the melting furnace 74 from above to pass through the fluoride solution 72, and extracted from a lower portion of the melting furnace 74 through the hole 73a of the gold crucible 73. Coating layers 78 of the fluoride solution 72 were provided on both surfaces of the ceramics elongated substrate 71 thus extracted from the hole 73a of the crucible 73. The thickness of each coating layer 78 was about 5 $\mu$m.

The ceramics elongated substrate 71 thus provided with the coating layers 78 was then introduced into the oxygen gas atmosphere furnace 84. In the oxygen gas atmosphere furnace 84, oxygen gas was supplied from the oxygen gas supply port 86 and exhausted from the oxygen gas exhaust port 87, so that oxygen gas partial pressure was 760 mmHg. The oxygen gas atmosphere furnace 84 was heated and temperature-controlled by the heater 85. Fluorine contained in the fluorides forming the coating layers 78 was replaced by oxygen in the oxygen gas atmosphere furnace 84, whereby composition of the coating layers 78 was converted into that of superconducting ceramics. The ceramics elongated substrate 71, thus provided with the coating layers 78 composed of superconducting ceramics, was extracted from the oxygen gas atmosphere furnace 84 as a superconducting ceramics elongated body 90.

The coating layers of the superconducting ceramics elongated body obtained in the aforementioned manner were analyzed by powder X-ray diffraction, to recognize that crystals forming the coating layers were in $K_2NiF_4$ type perovskite structure, which is typical crystal structure of high-temperature superconducting ceramics. The superconducting ceramics elongated body superconducted at the temperature of liquid nitrogen.

Even if the superconducting ceramics elongated body was bent in a radius of curvature of about 30 cm, no cracking was caused in the ceramics elongated substrate and the coating layers, while its superconductivity was not damaged.

Although the coating layers were formed on both surfaces of the tape-type ceramics elongated substrate, such a coating layer may be formed only on one surface. Further, the tape-type ceramics elongated substrate may be replaced by that in the form of a round wire. A mixture of fluoride fine particles may be applied to a substrate to be heated/molten upon application, and then heated under an oxygen gas atmosphere to convert the composition of the coating layer into that of superconducting ceramics.

Description is now made on an embodiment of a superconducting ceramics elongated body having a protective layer according to the present invention.

Figure 10:
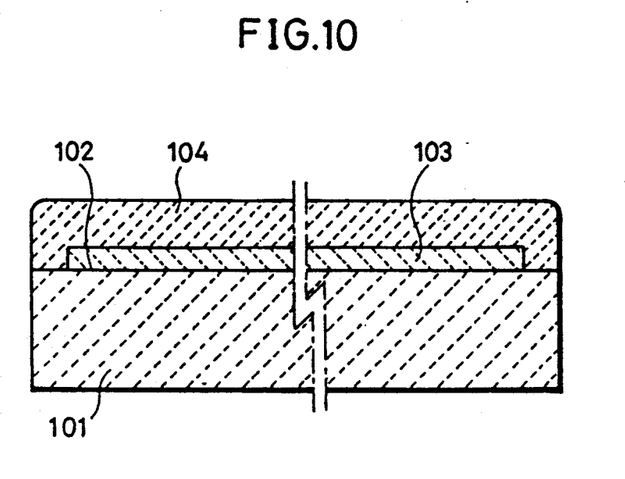
FIG. 10 is a sectional view showing a third embodiment of the superconducting ceramics elongated body according to the present invention.

FIG. 10 is an enlarged sectional view showing the embodiment of the superconducting ceramics elongated body having a protective layer. The superconducting ceramics elongated body shown in FIG. 10 comprises a tape-type elongated substrate 101, which is formed of ceramics to have flexibility. The elongated substrate 101 extends in a direction perpendicular to the plane of FIG. 10.

A superconducting layer 103 is formed on one major surface 102 of the elongated substrate 101. The superconducting layer 103 is formed of oxide ceramics, and extends longitudinally along the elongated substrate 101.

Surfaces of the superconducting layer 103 exposed on the elongated substrate 101 are covered with a protective layer 104, which is formed of ceramics containing a nitride. The protective layer 104 is in contact with both side edges of the major surface 102 of the elongated substrate 101, in order to cover the entire periphery of the superconducting layer 103, i.e., not only the upper surface but also the side surfaces of the superconducting layer 103, with the elongated substrate 101.

Description is now made on an experiment which was carried out in order to obtain a superconducting ceramics elongated body having the aforementioned structure.

First, a zirconia tape of 5 mm in width and 100 $\mu$m in thickness was prepared as the elongated substrate 101. Then, a superconducting layer 103 composed of $YBa_2Cu_3O_x$ ($x=6.3$ to 6.9) was formed in thickness of 5 $\mu$m on one major surface of the elongated substrate 101 by oxygen ion beam assist evaporation. Further, the protective layer 104 was formed by magnetron type reactive high-frequency sputtering under conditions of the degree of vacuum of $10^{-2}$ to $10^{-3}$ Torr. and making power of 200 W. The protective layer 104 was prepared by $Si_3N_4$ or "sialon". In the sputtering process, the ratio of N to Ar in the atmosphere was 0.5 when $Si_3N_4$ was employed, while the ratio of (N+O) to Ar was 0.5 when "stalon" was employed.

The superconducting ceramics elongated body thus obtained was introduced into a constant temperature/constant humidity bath having a temperature of 50° C. and relative humidity of 95%, to examine its moisture resistance. A reference example was prepared by an elongated body provided with no protective layer.

Both of the Example and reference example superconducted at the temperature of liquid nitrogen immediately after formation. In the reference example provided with no protective layer, however, the superconducting layer was partially peeled off in the so-called disconnected state after introduction into the constant temperature/constant humidity bath for 24 hours. On the other hand, the superconducting ceramics elongated body provided with the protective layer maintained its superconductivity, which was attained immediately after formation, even if 48 hours were passed in the constant temperature/constant humidity bath.

Then, the samples were bent in a prescribed radius of curvature, for evaluation of flexibility. In both of the samples, no disconnection was caused in the superconducting layers upon bending in a radius of curvature of 30 cm, and the superconducting states were maintained in the superconducting layers. In the sample provided with the protective layer, no disconnection was caused in the superconducting layer 103 even if the same was bent in a radius of curvature of 20 cm. Thus, it has been confirmed that the protective layer 104 was also adapted to improve mechanical strength of the superconducting ceramics elongated body.

Figure 11:
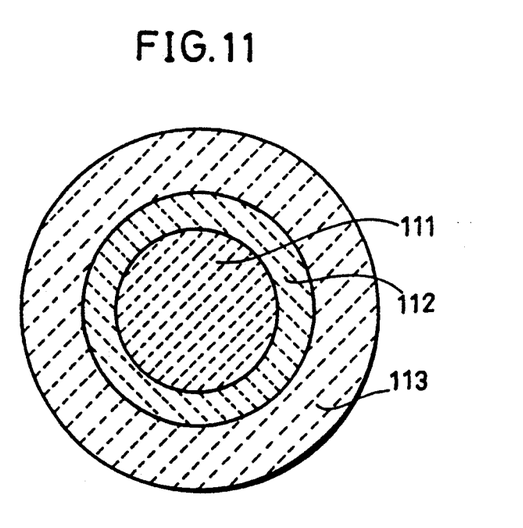
FIG. 11 is a sectional view showing a fourth embodiment of the superconducting ceramics elongated body according to the present invention.

FIG. 11 is an enlarged sectional view showing another embodiment of the superconducting ceramics elongated body having a protective layer according to the present invention.

In this embodiment, an elongated substrate 111 is provided in the form of a round wire, and a superconducting layer 112 is formed to cover its outer peripheral surface. Further, a protective layer 113 is formed to cover the outer peripheral surface of the superconducting layer 112. Other structure of this embodiment is similar to that of the embodiment shown in FIG. 10, and hence redundant description s omitted.

The entire sectional configuration of the superconducting ceramics elongated body according to the present invention and sectional configurations of the elongated substrate, the superconducting layer and the protective layer forming the same are not restricted to those described above, but may be arbitrarily modified.

As hereinabove described, the superconducting ceramics elongated body according to the present invention is flexible since the superconducting layer is formed on at least a part of the surface of the flexible ceramics elongated substrate. Thus the superconducting ceramics elongated body according to the present invention, which can be wound on a reel, for example, is highly practicable.

The superconducting ceramics elongated body according to the present invention is not restricted to a power transmission medium in the field of energy, but is also applicable to a switching element, a storage device, a magnetic flux sensor, an amplifying element or the like, which is employed as a device in the field of electronics.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a superconducting ceramics elongated body by forming a longitudinally continuous layer of an oxide superconducting ceramics at least on a part of the surface of a flexible ceramics elongated substrate, said method comprising:

a step of applying a solution, being obtained by adding water to an alcohol solution of a mixture containing at least compounds of either alkoxides or acetylacetonatos of respective metal elements for composing said oxide superconducting ceramics and hydrolyzing the same, or a solution, being obtained by respectively adding water to alcohol solutions of said compounds of said respective metal elements for separately hydrolyzing the same and mixing said hydrolyzed solutions with each other, to at least a part of the surface of said ceramics elongated substrate; and a step of heating and firing said coating layer formed on said ceramics elongated substrate to provide said superconducting layer.

2. A method of manufacturing a superconducting ceramics elongated body by forming a longitudinally continuous superconducting layer on at least a part of the surface of a flexible ceramics elongated substrate, said method comprising:

a step of rolling superconducting ceramics powder on the surface of said ceramics elongated substrate; and a step of heating and sintering applied said superconducting ceramics powder thereby to provide said superconducting layer.

3. A method of manufacturing a superconducting ceramics elongated body by forming a longitudinally continuous layer of an oxide superconducting ceramics on at least a part of the surface of a flexible ceramics elongated substrate, said method comprising:

a step of dissolving oxides serving as raw materials for said superconducting ceramics in a solution containing at least one fluoride having a melting point lower than those of said oxides;

a step of reacting said oxides in said fluoride solution to produce a composite oxide for forming said superconducting ceramics; and a step of bringing said fluoride solution into contact with the surface of said ceramics elongated substrate while reducing temperature distribution of said fluoride solution toward the surface of said ceramics elongated substrate to deposit said composite oxide on the surface of said ceramics elongated substrate, thereby to form said layer of the oxide superconducting ceramics.

4. A method of manufacturing a superconducting ceramics elongated body in accordance with claim 3, wherein said dissolving step comprises a step of dissolving said oxides in a solution of a mixture of fluorides of metal elements for composing said superconducting ceramics.

5. A method of manufacturing a superconducting ceramics elongated body in accordance with claim 4, wherein the ratios of respective metal elements contained in said mixture of said fluorides are equal to those of respective metal elements contained in said superconducting ceramics.

6. A method of manufacturing a superconducting ceramics elongated body comprising:

a step of mixing respective fluorides of cations for composing an oxide superconducting ceramics so that the ratios of respective said cations are equal to those of cations contained in said superconducting ceramics;

a step of longitudinally continuously applying said mixture to at least a part of the surface of a flexible ceramics elongated substrate to form a coating layer; and a step of heating said coating layer under an oxygen gas atmosphere to replace fluorine contained in fluorides forming said coating layer by oxygen thereby to convert said coating layer into a layer said superconducting ceramics.

7. A method of manufacturing a superconducting ceramics elongated body in accordance with claim 6, wherein said mixing step comprises a step of bringing said mixture into a heated/molten state.

8. A method of manufacturing a superconducting ceramics elongated body in accordance with claim 6, wherein said mixing step comprises a step of mixing said fluorides in the form of fine particles, and a coating step comprises a step of heating and melting said mixture after applying the same in the form of fine particles.

* * * * *